(12) United States Patent
Farooq et al.

(10) Patent No.: US 9,553,054 B2
(45) Date of Patent: Jan. 24, 2017

(54) STRAIN DETECTION STRUCTURES FOR BONDED WAFERS AND CHIPS

(71) Applicant: INTERNATIONAL BUSINESS MACHINES CORPORATION, Armonk, NY (US)

(72) Inventors: Mukta G. Farooq, Hopewell Junction, NY (US); John A. Fitzsimmons, Poughkeepsie, NY (US); Erdem Kaltalioglu, Newburgh, NY (US); Wei Lin, Albany, NY (US); Spyridon Skordas, Wappingers Falls, NY (US); Kevin R. Winstel, East Greenbush, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/522,083

(22) Filed: Oct. 23, 2014

(65) Prior Publication Data

US 2016/0118348 A1     Apr. 28, 2016

(51) Int. Cl.
*H01L 23/00*     (2006.01)
*H01L 21/288*     (2006.01)
(Continued)

(52) U.S. Cl.
CPC ......... *H01L 23/562* (2013.01); *H01L 21/2885* (2013.01); *H01L 21/302* (2013.01);
(Continued)

(58) Field of Classification Search
CPC .............................. H01L 22/34; H01L 21/2007
See application file for complete search history.

(56) References Cited

U.S. PATENT DOCUMENTS 7,355,201 B2    4/2008   Zhu et al.
7,365,556 B2    4/2008   Cano et al.
(Continued)

FOREIGN PATENT DOCUMENTS

WO    2011046844 A1    4/2011
WO    2012015550 A2    2/2012

OTHER PUBLICATIONS

Chao et al., "Dual Damascene BEOL Processing Using Multilevel Step and Flash Imprint Lithography," Proc. of SPIE, vol. 6921, 69210C, 2008, 14 pages.

(Continued)

*Primary Examiner* — Jerome Jackson, Jr.
*Assistant Examiner* — David Spalla
(74) *Attorney, Agent, or Firm* — Yuanmin Cai; Andrew M. Calderon; Roberts Mlotkowski Safran Cole & Calderon. P.C.

(57) ABSTRACT

Strain detection structures used with bonded wafers and chips and methods of manufacture are disclosed. The method includes forming lower metal wiring structures associated with a lower wafer structure. The method further includes bonding the lower wafer structure to an upper wafer structure and thinning the upper wafer, and forming upper metal wiring structures. The method further includes electrically linking the lower metal wiring structures to the upper metal wiring structures by formation of through silicon via structures to form an electrically connected chain extending between multiple wafer structures. The method further includes forming contacts to an outside environment which electrically contact two of the lower metal wiring structures.

12 Claims, 4 Drawing Sheets

(51) Int. Cl.
  *H01L 21/302* (2006.01)
  *H01L 21/66* (2006.01)
  *H01L 21/768* (2006.01)
  *H01L 25/00* (2006.01)
  *H01L 25/065* (2006.01)
  *H01L 23/48* (2006.01)

(52) U.S. Cl.
  CPC ........ *H01L 21/76898* (2013.01); *H01L 22/34* (2013.01); *H01L 25/0657* (2013.01); *H01L 25/50* (2013.01); *H01L 23/481* (2013.01); *H01L 2225/06541* (2013.01); *H01L 2924/0002* (2013.01)

(56) References Cited

U.S. PATENT DOCUMENTS

| | | |
|---|---|---|
| 7,851,237 B2 | 12/2010 | Walter |
| 7,960,242 B2 | 6/2011 | Or-Bach et al. |
| 8,058,137 B1 | 11/2011 | Or-Bach et al. |
| 8,153,499 B2 | 4/2012 | Or-Bach et al. |
| 8,263,795 B2 | 9/2012 | Norman et al. |
| 8,323,991 B2 | 12/2012 | Fischer et al. |
| 8,347,728 B2 | 1/2013 | Aitken |
| 8,362,622 B2 | 1/2013 | Sproch et al. |
| 8,373,230 B1 | 2/2013 | Or-Bach et al. |
| 8,373,439 B2 | 2/2013 | Or-Bach |
| 8,378,715 B2 | 2/2013 | Or-Bach et al. |
| 8,541,819 B1 | 9/2013 | Or-Bach et al. |
| 8,546,155 B2 | 10/2013 | D'Aleo et al. |
| 2003/0157748 A1* | 8/2003 | Kim ............... H01L 21/76804 438/107 |
| 2011/0101347 A1* | 5/2011 | Henderson ............ G01N 3/066 257/48 |
| 2012/0006122 A1 | 1/2012 | Aitken |
| 2012/0107967 A1 | 5/2012 | Or-Bach et al. |
| 2012/0255365 A1* | 10/2012 | Wimplinger ...... H01L 21/67092 73/760 |
| 2013/0122672 A1 | 5/2013 | Or-Bach et al. |
| 2013/0240884 A1* | 9/2013 | Barth ............... H01L 23/544 257/48 |

OTHER PUBLICATIONS

Zhang et al., "Development of Through Silicon via (TSV) Interposer Technology for Large Die (21×21mm) Fine-Pitch Cu/low-k FCBGA Package," 59th Electronic Components and Technology Conference, ECTC, 2009, pp. 305-312.

Liu et al., "Electrical Characterization of 3D Through-Silicon-Vias," 60th Electronic Components and Technology Conference, ECTC, 2010, pp. 1100-1105.

Chang et al., "Electrical and Reliability Investigation of Cu TSVs With Low-Temperature Cu/Sn and BCB Hybrid Bond Scheme," IEEE Electron Device Letters, vol. 34, No. 1, 2013, pp. 102-104.

* cited by examiner

STRAIN DETECTION STRUCTURES FOR BONDED WAFERS AND CHIPS

FIELD OF THE INVENTION

The invention relates to semiconductor structures and, more particularly, to strain detection structures used with bonded wafers and chips and methods of manufacture.

BACKGROUND

Wafer bonding is a packaging technology on wafer-level for the fabrication of microelectronics and optoelectronics devices. The wafer bonding ensures mechanically stable packages. The bonding process can be, for example, direct bonding, oxide bonding, adhesive bonding, thermal bonding, etc.

Wafer bonding can offer many advantages with respect to through silicon via scaling. However, challenges from strain involved with wafer bonding can affect process yield in a negative way, leading to broken wafers, delamination, etc. For example, chip dicing following the conclusion of wafer stacking can pose a risk of cracking and/or damage to the stacked structure. In addition, or alternative, thermal processes can result in cracking or delamination during the manufacturing processes due to coefficient of thermal expansion (CTE) mismatch of materials.

SUMMARY

In an aspect of the invention, a method comprises forming lower metal wiring structures associated with a lower wafer structure. The method further comprises bonding the lower wafer structure to an upper wafer structure and thinning the upper wafer, and forming upper metal wiring structures. The method further comprises electrically linking the lower metal wiring structures to the upper metal wiring structures by formation of through silicon via structures to form an electrically connected chain extending between multiple wafer structures. The method further comprises forming contacts to an outside environment which electrically contact two of the lower metal wiring structures.

In an aspect of the invention, a method comprises bonding together multiple wafer structures. The method further comprises forming a metal structure which is isolated from active devices, and which extends between multiple layers of the multiple wafer structures to measure either resistance or capacitance.

In an aspect of the invention, a device comprises: a first metal structure extending between multiple wafer structures, which respond electrically to thermal and strain energies in a three axial plane; and a connecting structure connecting the first structure to an outside environment.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
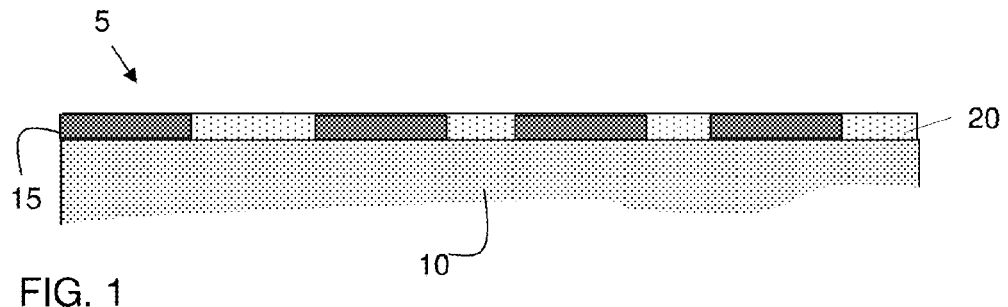
FIG. 1 shows a starting structure and respective processing steps in accordance with aspects of the present invention.

The invention relates to semiconductor structures and, more particularly, to strain detection structures used with bonded wafers and chips and methods of manufacture. More specifically, the present invention provides strain detection structures for increasing yield enhancement in bonded wafers/chips in multistacked structures. Advantageously, by implementing the strain detection structures and methods of manufacture, it is now possible to provide solutions for detecting strain in bonded wafers in order to avoid subsequent stacking of unsuitable wafers, thereby eliminating any waste. Additionally, the strain detection structures can test for strain in bonding interfaces below the surface of a wafer or chip stack. Moreover, as the strain detection structures are integrated into the chip stack, it provides the ability to test strain after thermal stress, packaging, site failure, etc.

In embodiments, the strain detection structures and methods of manufacture implement a variety of differently configured 3D via/TSV (through silicon vias)/line chains running between multiple chips or wafers in an orthogonally integrated structure (i.e., wafer/chip multistack). The 3D via/TSV/line chains can include, e.g., copper (or other metal or metal alloy) structures formed prior to and/or after bonding. In this way, the strain detection structures of the present invention can be used for strain diagnosis, which could be caused by wafer to wafer bonding, associated preparation steps or downstream 3D process flow (dicing), as examples.

In even more specific embodiments, the strain detection structures are implemented with bonded wafers to avoid subsequent resulting waste before or after wafers are stacked in a multistack configuration. In additional or alternative embodiments, the strain detection structures can detect strain in bonded wafers to predict or detect device failure due to stress damage. The strain detection structures can include, for example, structures designed to respond resistively (or capacitive) to both thermal and strain energies in a three axial plane, and to respond to thermal energies that the structure may have during the response to strain in a system. In embodiments, the strain detection structures may be placed in proximity to a chip on a wafer without restriction and thus, may enable more sensitive thermal compensation and thereby more accurate strain measurements.

The strain detection structures of the present invention can be manufactured in a number of ways using a number of different tools. In general, though, the methodologies and tools are used to form structures with dimensions in the micrometer and nanometer scale. The methodologies, i.e., technologies, employed to manufacture the strain detection structures of the present invention have been adopted from integrated circuit (IC) technology. For example, the structures of the present invention are built on wafers and are realized in films of material patterned by photolithographic processes on the top of a wafer. In particular, the fabrication of the strain detection structures of the present invention uses three basic building blocks: (i) deposition of thin films of material on a substrate, (ii) applying a patterned mask on top of the films by photolithographic imaging, and (iii) etching the films selectively to the mask.

FIG. 1 shows a starting structure in accordance with aspects of the present invention. In embodiments, the starting structure 5 includes an acceptor wafer 10. In embodiments, the acceptor wafer 10 can be any wafer, e.g., silicon. More specifically, the acceptor wafer 10 (e.g., substrate) can be composed of semiconductor material, such as a silicon crystal. In other examples, the acceptor wafer 10 may be composed of any suitable material including, but not limited to, Si, SiGe, SiGeC, SiC, GE alloys, GaAs, InAs, InP, and other III/V or II/VI compound semiconductors.

In embodiments, metal wiring structures 15 are formed on the acceptor wafer 10. The metal wiring structures 15 can be composed of copper; although other suitable metals are also contemplated by the present invention. In embodiments, the metal wiring structures 15 can be formed by either an additive or subtractive process, as should be understood by those of ordinary skill in the art. For example, the metal wiring structures 15 can be formed through a single or dual damascene process. In such a process, a dielectric material 20 is formed on the wafer acceptor wafer 10, which then undergoes conventional lithography and etching processes. Illustratively, a resist can be formed on the dielectric material 20 and patterned by exposure to energy (light). The patterning will result in openings which provide a window for etching processes, e.g., removal of exposed material. In embodiments, the etching can be a reactive ion etching (RIE) used with the appropriate etchants to remove the exposed material. After etching, any remaining resist material can then be removed by an oxygen ashing process or other stripping processes known to those of skill in the art. Metal can then be deposited within the openings using a conventional deposition method. Any remaining metal on the surface of the dielectric material can be removed by a mechanical chemical process (CMP).

Figure 2:
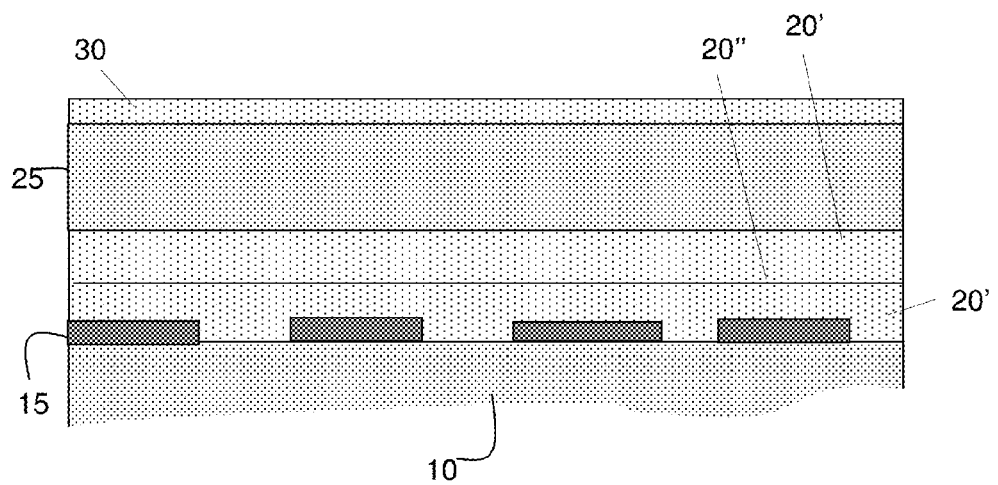
FIGS. 2 and 3 show additional structures and respective processing steps in accordance with aspects of the present invention.

Referring to FIG. 2, additional insulator bonding material 20' is formed on the structure of FIG. 1, e.g., over the metal wiring structures 15 and exposed portions of the acceptor wafer 10. In embodiments, the insulator material 20' can be an oxide or other low-k dielectric material used as a bonding material for subsequent bonding processes. The insulator material 20' can be blanket deposited on the structure using, for example, CVD, low pressure CVD (LPCVD), or atomic layer deposition (ALD) processes known to those of skill in the art. After formation of the insulator material 20, a donor wafer 25 with a bonding layer (insulator material) 20' is bonded to the existing structure, e.g., acceptor wafer 10 with metal wiring structures 15 and bonding layer 20, as represented by bonding interface 20". (Hereinafter, the bonding layers 20, 20' and interface 20" are shown generally as layer 20.) The bonding is provided by, for example, an oxide bonding process as is known to those of skill in the art; although other bonding techniques are also contemplated by the present invention.

Figure 3:
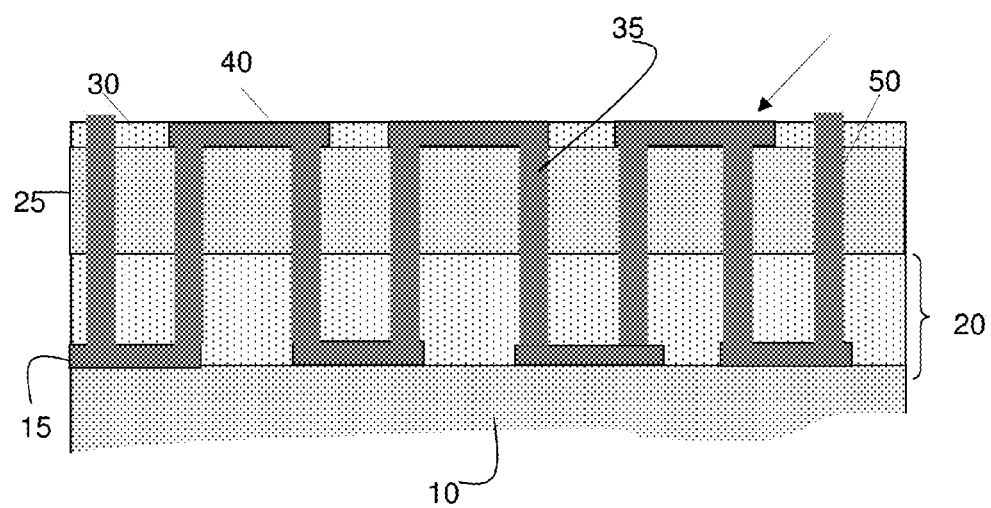

In FIG. 3, an insulator layer 30 is formed on the backside of the thinned donor wafer 25. Thinning of the backside of the donor wafer 25 is thinned to about less than 50 microns in order to enable through silicon processing. In embodiments, the insulator layer 30 can be formed after bonding. The insulator layer 30 can be an oxide material or other low-k dielectric material, which is blanket deposited on the donor wafer 25 using, for example, CVD or ALD processes. The via structures 35 and wiring structures 40 are then formed to electrically link together the wiring structures 15 formed on the acceptor wafer 10. In this way, a metal chain is formed through the multistack structure shown in FIG. 3.

As should be understood by those of skill in the art, the metal chain structure thus formed, e.g., designated at reference numeral 45, can be used as a resistance based strain gauge. It is noteworthy that these can be formed in parallel to the TSV processing that connects electrically the wafer chips to the acceptor wafer chips, thus completing inter-wafer chip connectivity and strain detection structure connectivity at the same time.

In embodiments, the via structures 35 can be through silicon vias formed using a conventional single damascene process. Alternatively, the via structures 35 and the wiring structures 40 can be formed by a dual damascene process. By way of example, in a dual damascene process, a through silicon via can be etched through the insulator layer 30, donor wafer 25 and the insulator material 20, to expose portions of the underlying metal wiring structures 15. The etching can be performed using conventional lithography and etching (RIE) processes. Subsequently, a trench can be formed in the insulator layer 30. A metal can then be deposited within the via and the trench to form the via structures 35 and the wiring structures 40. In this way, a metal line is provided through multiple layers of a stacked structure to form a resistance based strain gauge 45, and which is isolated from any devices on a chip.

In embodiments, the via structures 35 can be lined with a metal or metal alloy, e.g., tantalum nitride, titanium nitride, etc., using a plasma vapor deposition (PVD) process; although other deposition processes are also contemplated by the present invention such as atomic layer deposition (ALD) or CVD processes. A copper material can then be deposited within the via using an electroplating process. In embodiments, the copper will also fill the trench. The structure can then undergo a planarization process, e.g., chemical mechanical polishing (CMP).

In embodiments, deep via structures 50 can be formed to electrically contact with the metal wiring structures 15 at the ends of the resistance based strain gauge 45. The deep via structures 50 can be formed during the same lithography, etching and deposition processes as the via structures 35 and the wiring structures 40. These deep via structures 50 provide contact to the outside environment. After the formation of the structures of the present invention, individual chips can be diced from the wafer, for example.

As shown in Table 1.1, below, the strains of metals are known. As the strains of different metals are known, these metals can be implemented as metals used in the resistance based strain gauge 45 (or capacitance based strain gauge) of the present invention in order to measure the overall strain on a multistack structure, due to thermal processes (e.g., mismatches of coefficient of thermal expansion (CTE) between materials), bonding processes, dicing processes, etc.

TABLE 1.1

Strain Sensitivities of Metals

| Metal or alloy | Trade name | Typical strain sensivity (elastic range) |
| --- | --- | --- |
| Iron | — | +4.0 |
| Copper | — | +2.6 |
| Silver | — | +3.0 |

TABLE 1.1-continued

Strain Sensitivities of Metals

| Metal or alloy | Trade name | Typical strain sensivity (elastic range) |
|---|---|---|
| Nickel | — | −12.0 |
| Platinum | — | +6.0 |
| Titanium (commercially pure) | — | −1.1 |
| Titanium (6AL4V alloy) | — | −0.2 |
| Aluminum | — | +0.85 |
| Copper-nickel 55-45 (constantan) | Advance, Cupron, Copel, etc. | +2.1 |
| Nickel-chromium 80-20 | Nichrome V, Tophet A, etc. | +2.2 |
| Copper-nickel-manganese (manganin) | Manganin | +0.6 |
| Nickel-chromium 75-20 + additions | Karma, Evanohm, Chromel R, etc. | +2.1 |
| Iron-nickel-chromium | 18-8 Stainless | +2.6 |
| Iron-chromium-molybdenum | Iso-elastic | +3.5 |
| Gold-chromium | — | 0.0 |
| Iron-chromium-aluminum | Armour D, Alloy 815, Alchrome Special, etc. | +2.4 |
| Copper-gold | — | −80 to −120 |
| Platinum-tungsten 92-8 | Alloy 479, etc. | +4.1 |

The strain sensitivity of a multistack structure can be measured using the resistance based strain gauge described herein using the following equation:

$$Fs=(\Delta R/R_0)/(\Delta L/L_0).$$

In this equation, Fs=strain sensitivity; ΔR=resistance change; and ΔL=length change. By using the resistance based strain gauges described herein a maximum measurement of 50-250 ohm resistance change would be expected for a 1 mm long resistance based strain gauges structure with a 100-400 um wafer bow (at full wafer thickness).

Figure 4:
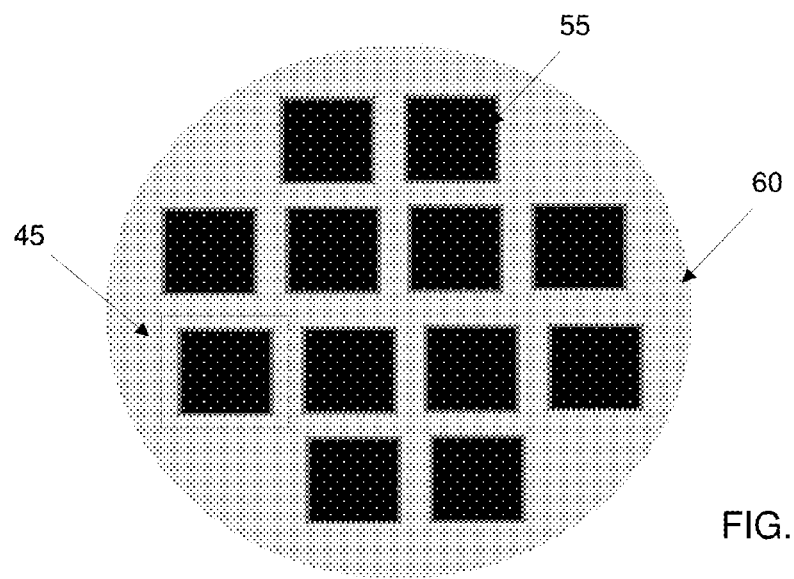
FIG. 4 shows a top view of the structure of FIG. 3.

FIG. 4 shows a top view of a resistance based strain gauge 45 of FIG. 3, for example. It should be understood that this strain gauge can be a capacitance strain gauge as further described herein, both of which are generally described herein as a strain gauge. In this representation, it is shown that the strain gauge 45 can be provided within the kerf areas, e.g., around a perimeter of a chip 55, of the stacked structure. In embodiments, though, the strain gauge 45 can be provided directly within the active area of chip 55, in unused areas. In any of the embodiments, though, the strain gauge 45 is isolated from any devices (active or passive) on a chip.

Also, still referring to FIG. 4, the strain gauge 45 can be provided at any separate level, multiple separate levels or all levels or combinations thereof of the multistack configuration, as represented by reference numeral 60. That is, the resistance based strain gauge 45 can extend through each layer, or any combination of layers, with the deep vias structure 50 (e.g., contacts shown in FIG. 3) providing contact to the environment for each of the strain gauges 45. Also, the strain gauge 45 can be provided at any side or sides of the chip (as with any of the embodiments described herein). Accordingly, with the different embodiments described herein, it is possible to measure the strain at any separate level, multiple separate levels, all levels or combinations thereof, or specific areas of the multistack configuration.

Figure 5:
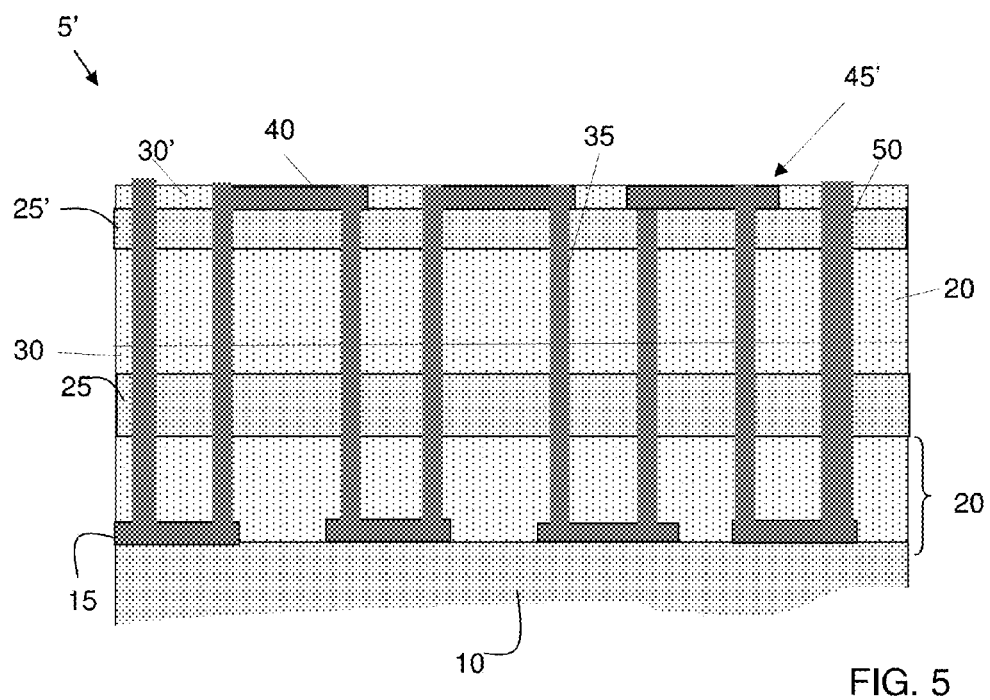
FIG. 5 shows a resistance based strain gauge and respective processing steps in accordance with aspects of the present invention.

By way of example, FIG. 5 shows a resistance based strain gauge 45' provided through multiple wafers, e.g., acceptor wafer 10 and donor wafers 25, 25'. It should be understood that the resistance based strain gauge 45' can extend though more or less levels, as contemplated by the present invention. FIG. 5 also represents the methods of manufacturing the structure 5'.

In the structure 5' of FIG. 5, for example, the metal wiring structures 15 are formed on the acceptor wafer 10 as described herein. After stacking of the donor wafers 25 and 25' by bonding processes of the insulator layers 20 for each respective wafer 25, 25', a top insulator layer 30' can be formed on the donor wafer 25'. The top insulator layer 30' can be an oxide material or other low-k dielectric material, which is blanket deposited on the donor wafer 25' using, for example, CVD processes. The via structures 35 and wiring structures 40 are then formed to electrically link together the wiring structures 15 formed on the acceptor wafer 10. In this way, a metal chain is formed through multiple stacks of the multistack structure. According, the resistance based strain gauge 45' can now be used to detect strain through multiple levels of the stacked structure.

Figure 6:
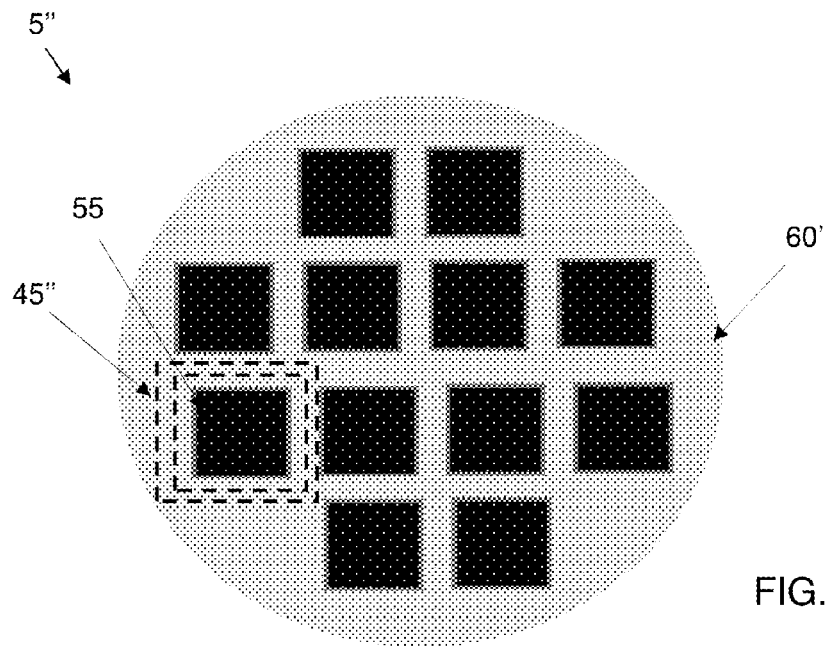
FIG. 6 shows a top view of a resistance based strain gauge and respective processing steps in accordance with additional aspects of the present invention.

FIG. 6 shows a representation of the strain gauge 45" (resistance or capacitance) formed through different layers of the multistack structure 60'. FIG. 6 also represents the methods of manufacturing the structure 5", e.g., multistack structure 60'. In this representation, two strain gauges represented at reference numeral 45" are formed at different levels of the multistack structure 60'. In this configuration, the strain gauges 45" are formed concentrically about the chip 55; although other configurations are also contemplated by the present invention as described, e.g., with respect to FIG. 4. For example, the strain gauges 45" can be provided about different chips, at different levels or any combination of within and outside of the active area of the chips 55. It should also be understood that each of the resistance based strain gauges 45" will have contacts to the outside environment (as also represented by the concentric structures). Also, it should be understood by those of skill in the art the strain gauges 45" are representative of strain gauges 45" formed in any combination of single or multiple levels as described herein.

Figure 7:
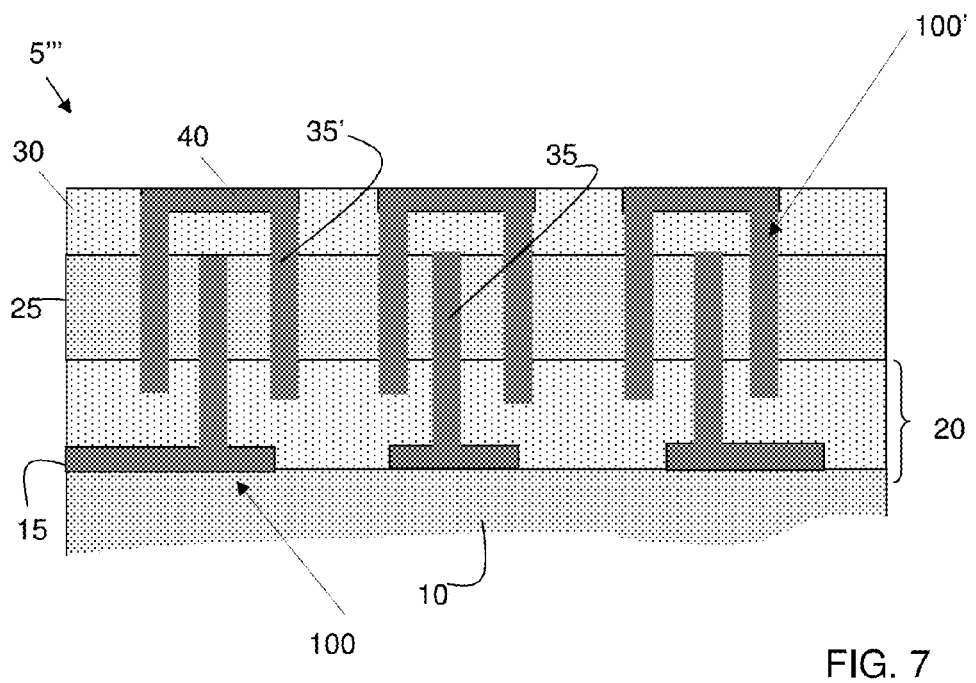
FIG. 7 shows a capacitance based strain gauge and respective fabrication processes in accordance with aspects of the present invention.

FIG. 7 shows a capacitance based strain gauge and respective fabrication processes in accordance with aspects of the present invention. In this structure 5"', a first portion 100 of the capacitance based strain gauge comprises the metal wiring structures 15 and via structures 35 extending between two wafer structures 10 and 25, formed using the processes and materials as described herein. For example, the metal wiring structures 15 are formed by deposition processes on the wafer 10, either by an additive or subtractive process. The via structures 35 are formed after the bonding thinning process, e.g., bonding of the two wafers 10, 25, by etching and deposition processes, as already described herein, prior to or after deposition of the insulator layer 30.

On the other hand, the second portion 100' of the capacitance based strain gauge can be formed after the deposition of the insulator layer 30 and bonding/thinning process. The second portion 100' of the capacitance based strain gauge comprises the metal wiring structures 40 and via structures 35' extending through the wafer structure 25 (and partly through the insulator layer 20) using the processes already described herein. For example, the metal wiring structures 40 and via structures 35' can be formed using single or dual damascene processes as described herein. The metal wiring structures 40 can be formed in or on the insulator layer 30, whereas, the via structures 35' are formed extending through the insulator layer 30 (in electrical contact with the wiring structures 40) and interweaved (alternating) with the via structures 35. In this way, a capacitance can be measured between the via structures 35, 35'.

Figure 8:
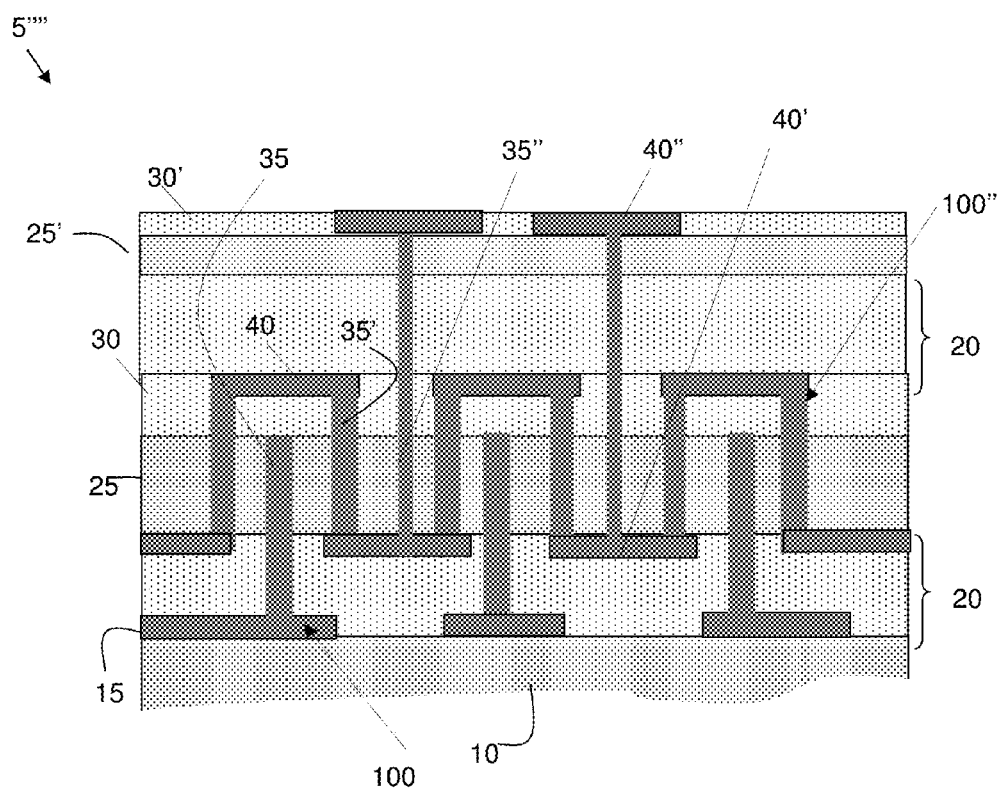
FIG. 8 shows a capacitance based strain gauge and respective fabrication processes in accordance with additional aspects of the present invention.

FIG. 8 shows a capacitance based strain gauge and respective fabrication processes in accordance with aspects of the present invention. In this structure 5''', a first portion 100 of the capacitance based strain gauge comprises the metal wiring structures 15 and via structures 35 extending between two wafer structures 10 and 25, formed using the processes and materials as described herein. For example, the metal wiring structures 15 are formed by deposition processes on the wafer 10, either by an additive or subtractive process. The via structures 35 are formed after the bonding process, e.g., bonding of the two wafers 10, 25, by etching and deposition processes, as already described herein, prior to or after deposition of the insulator layer 30. As should be understood, the via structures 35 would extend into the insulator layer 30 when formed after deposition of the insulator layer 30.

On the other hand, the second portion 100'' of the capacitance based strain gauge comprises the metal wiring structures 40, 40' and via structures 35' extending through the wafer 25 (and partly through the insulator layer 20) to electrically connect together the metal wiring structures 40, 40'. In embodiments, the metal wiring structures 40, 40' can be formed on opposing sides of the wafer 25, with the metal wiring structures 40 being formed prior to the bonding process and the metal wiring structures 40 being formed after the bonding process, with a dual damascene process for fabricating the via structures 35', for example. Alternatively, the metal wiring structures 40 and via structures 35' can be formed using two single damascene processes as described herein. The metal wiring structures 40 can be formed in or on the insulator layer 30, whereas, the via structures 35' are formed through the insulator layer 30 and wafer structure 25 (in electrical contact with the wiring structures 40) and interweaved (alternating) with the via structures 35. In this way, a capacitance can be measured between the via structures 35, 35'. Also, the second portion 100'' of the capacitance based strain gauge can be a resistance based strain gauge, by itself, for a different layer in the structure.

After metal deposition processes to form the metal wiring structures 40 and via structures 35', wafer 25' can be bonded to the structure in a conventional manner as described herein. The insulator layer 30' can then be formed, e.g., deposited, on the wafer 25'. In embodiments, after the bonding and deposition processes, deep via structures 35'' can be formed to electrically contact with the portion 100'' of the capacitance based strain gauge, e.g., wiring structures 40'. The deep via structures 35'' can be capped with a wiring structure 40'' in embodiments. The deep via structures 35'' and the wiring structures 40'' can be formed using lithography, etching and deposition processes as described herein, extending to any of the respective layers in which the portion 100'', is formed. These deep via structures 35'' will provide electrical contact to the outside environment. After the formation of the structures of the present invention, individual chips can be diced from the wafer, for example.

As should thus be understood, the strain gauges described herein are multiplanar as well as multiaxial devices. In this way, the strain gauges of the present invention can provide electrical measurement of physical or thermal stress on a substrate or multiplanar structure by changes in electrical resistance or capacitance, which are intrinsically more linear in response than a piezoelectric effect. It should be noted that the gauge structures can be independently tested as they are not connected to the functional circuitry of the chip. Also, such strain structures can be segmented and not one line around a chip in order to provide for localized detection capability as needed.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A device comprising:
a first metal structure comprising at least one metal via structure extending through multiple layers of a bonded wafer structure comprising multiple bonded wafers, the first metal structure responds electrically to thermal and strain energies in a three axial plane and the at least one metal via structure extends through multiple layers comprising at least one wafer structure and one insulator lager of the bonded wafer structure;
a second metal structure interleaved with the first metal structure, wherein a combination of the first metal structure and the second metal structure measure a capacitance in response to the thermal and strain enemies in the three axial plane;
a connecting structure connecting the first metal structure to an outside environment; and
at least one wiring structure on a surface of a wafer of the bonded wafer structure, which connects to a first end of two metal via structures,
wherein:
the at least one wiring structure is two wiring structures;
a first of the two wiring structures is on a surface of a first wafer and connects to the first end of a first metal via structure and a second metal via structure of the at least one metal via structure; and
a second of the two wiring structures is on a surface of a second wafer and connects to a second end of the second wiring structure and an end of a third wiring structure, at a same level, of the at least one metal via structure.

2. The device of claim 1, wherein the first metal structure comprising upper wiring structures and lower wiring structure, connected together by via structures extending between the multiple wafer structures.

3. The device of claim 1, wherein the at least one metal via structure extends through multiple layers comprising at least two wafer structures and two insulator layers of the bonded wafer structure.

4. The device of claim 3, wherein the at least two wafer structures comprise three wafers, wherein a third wafer is provided between the first wafer and the second wafer.

5. A device comprising:
 a first metal structure comprising at least one metal via structure extending through multiple layers of a bonded wafer structure comprising multiple bonded wafers, the first metal structure responds electrically to thermal and strain energies in a three axial plane and the at least one metal via structure extends through multiple layers comprising at least one wafer structure and one insulator layer of the bonded wafer structure;
 a connecting structure connecting the first metal structure to an outside environment; and
 at least two wiring structures, wherein:
 the at least one wafer structure is two wafer structures;
 the at least one metal via structure is three metal via structures;
 a first of the two wiring structures connects to only one of the three metal via structures;
 the first of the two wiring structures is on a surface of a first wafer structure of the two wafer structures;
 a second of the two wiring structures is above a surface of a second wafer of the two wafer structures and connects to a first end of a second metal via structure and a third metal via structure of the three metal via structures; and
 the first metal via structure is interleaved between the second and third metal via structures.

6. The device of claim 1, wherein the at least one metal via structure comprises a liner and an electroplated copper material.

7. The device of claim 1, wherein the bonded wafer structure comprises a multistacked structure comprising at least a lower wafer structure, an upper wafer structure and at least one additional wafer between the upper wafer structure and the lower wafer structure, and bonded together with intervening insulator layers with the at least one metal via structure extending therein, to form either a resistance strain gauge or a capacitance strain gauge electrically isolated from active devices.

8. The device of claim 7, wherein the at least one metal via structure forms at least two strain gauges concentrically formed in a pattern on different layers.

9. The device of claim 1, wherein the at least one metal via structure is in a kerf area.

10. The device of claim 1, wherein the at least one metal via structure is isolated from active devices, and which extends between multiple wafer structures of the bonded wafer structure.

11. The device of claim 10, wherein the multiple wafer structures comprises at least two bonded wafer structures.

12. The device of claim 11, wherein the multiple wafer structures comprises at least three bonded wafer structures.

* * * * *